(12) United States Patent
Oizumi et al.

(10) Patent No.: US 6,747,353 B2
(45) Date of Patent: Jun. 8, 2004

(54) BARRIER LAYER FOR COPPER METALLIZATION IN INTEGRATED CIRCUIT FABRICATION

(75) Inventors: Munenori Oizumi, Ibaraki (JP); Katsuhiro Aoki, Ibaraki (JP); Yukio Fukuda, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/982,655

(22) Filed: Oct. 18, 2001

(65) Prior Publication Data

US 2002/0063337 A1 May 30, 2002

Related U.S. Application Data

(60) Provisional application No. 60/253,244, filed on Nov. 27, 2000.

(51) Int. Cl.[7] .................. H01L 23/48; H01L 23/52
(52) U.S. Cl. ............... 257/751; 257/752; 257/762; 257/764
(58) Field of Search .................. 257/751, 752, 257/758, 761, 762, 763, 767, 764; 438/626, 627, 683, 685, 687

(56) References Cited

U.S. PATENT DOCUMENTS 6,136,682 A * 10/2000 Hegde et al. ............ 438/622
6,376,371 B1 * 4/2002 Jain et al. ............... 438/681

OTHER PUBLICATIONS

Hara et al., "Barrier Effect of TaSiN Layer for Oxygen Diffusion," *J. Electrochem. Soc.*, vol. 143, No. 11, Nov. 1996@The Electrochemical Society, Inc., pp. L264–L266.

Onishi et al., "A Half-Micron Ferreolectric Memory Cell Technology with Stacked Capacitor Structure," IEDM 94-843-846.

Kim et al., "Nanostructured Ta–Si–N diffusion barriers for Cu metallization," *J. Appl. Phys. 82 (10)*, Nov. 15, 1997, pp. 4847–4851.

Reid et al., "Amorphous (Mo, Ta, or W)–Si–N diffusion barriers for Al metallizations," J. Appl. Phys. 79 (2), Jan. 15, 1996, pp. 1109–1115.

Kolawa et al., "Sputtered Ta–Si–N Diffusion Barriers in Cu Metallizations for Si," IEEE Electron Device Letters, vol. 12, No. 6, Jun. 1991, pp. 321–323.

* cited by examiner

*Primary Examiner*—Hung Vu
(74) *Attorney, Agent, or Firm*—Jacqueline J. Garner; W. James Brady III; Frederick J. Telecky, Jr.

(57) ABSTRACT

A barrier layer (20, 62) for an integrated circuit structure is disclosed. The barrier layer (20, 62) is a refractory metal silicon compound, such as a refractor metal silicon nitride compound, formed in an amorphous state. The barrier layer (20, 62) has a relatively low composition ratio of silicon, and of nitrogen if present, to provide low resistivity in combination with the high diffusion barrier properties provided by the amorphous state of the film. A disclosed example of the barrier layer (20, 62) is a compound of tantalum, silicon, and nitrogen, formed by controlled co-sputtering of tantalum and silicon in a gas atmosphere including nitrogen and argon. The barrier layer (20) may be used to underlie copper metallization (22), or the barrier layer (62) may be part or all of a lower plate in a ferroelectric memory capacitor (70).

13 Claims, 5 Drawing Sheets

BARRIER LAYER FOR COPPER METALLIZATION IN INTEGRATED CIRCUIT FABRICATION

CROSS-REFERENCE TO RELATED APPLICATIONS

This application claims priority under 35 USC §119(e)(1) of provisional application No. 60/253,244 filed Nov. 27, 2000.

STATEMENT REGARDING FEDERALLY SPONSORED RESEARCH OR DEVELOPMENT

Not applicable.

BACKGROUND OF THE INVENTION

This invention is in the field of integrated circuit fabrication, and is more specifically directed to the formation of metal conductor layers in integrated circuits.

For many years, aluminum metallization has been widely used in the fabrication of conductors in conventional integrated circuits. Aluminum metallization, either pure or doped with silicon, copper, or other impurities, has been used in the manufacture of integrated circuits, particularly because of its ease of deposition and ease of patterning and etching, while providing interconnections of reasonable conductivity. However, the use of aluminum necessitates subsequent manufacturing processes to be maintained at relatively low temperatures, given the low melting temperature of aluminum and also its reactivity with other materials, such as silicon.

Copper has been an attractive material for the realization of integrated circuit conductors for such time, due to its much higher conductivity than aluminum. This higher conductivity has become even more important with the ever-decreasing conductor line widths necessary to achieve the maximum integrated circuit device density, and minimum chip area. Additionally, copper is more stable, in the electromigration sense, than is aluminum; indeed, as noted above, aluminum metallization is doped with copper for this very reason. Copper metallization is thus able to withstand higher current densities than aluminum. As such, the use of copper conductors in integrated circuits has enabled reduced conductor feature sizes from that possible for aluminum.

However, as is also well known in the art, copper atoms diffuse very rapidly in silicon. Once diffused into silicon, copper ions operate as recombination sites, destroying the functionality of conventional metal-oxide-semiconductor (MOS) transistors. Adequate barriers between copper metallization and the underlying silicon have therefore become essential, especially in MOS devices, to obtain the important benefits of copper metallization.

As is well known in the art, barrier layers are formed to underlie copper conductors and via plugs in conventional integrated circuits. These barrier layers are typically formed of metal, or metal compounds, so as to be electrically conductive. Barrier layer conductivity is particularly important at those locations where the copper conductors make contact to underlying conductor layers, contact plugs, and underlying silicon, as the barrier layer is effectively in series between the copper conductor and the underlying feature.

Another use of barrier material in conventional integrated circuits appears in ferroelectric memory capacitors. Typically, barrier materials are provided on either side of the ferroelectric material, primarily to prevent the diffusion of oxygen from the ferroelectric material (e.g., PZT) into contact plugs. Such oxygen diffusion into the contact plugs has the effect of degrading contact resistance, as described in Onishi, et al., "A Half-Micron Ferroelectric Memory Cell Technology with Stacked Capacitor Structure", *Technical Digest, Int'l Electron Devices Meeting*, paper 32.4.1 (IEEE, 1994).

According to conventional technology, tradeoffs between diffusion barrier effectiveness and barrier layer conductivity have been required. For example, crystalline materials such as TiN have good conductivity, but provide relatively weak diffusion barriers. On the other hand, amorphous films of refractory metal nitrides (e.g., amorphous TaN), and of silicon-nitride refractory metal compounds (e.g., amorphous films of TaSiN and WSiN) are excellent diffusion barrier materials, but are quite resistive relative to the crystalline films such as TiN.

Based on the foregoing, it has been observed that the diffusion barrier property of barrier materials relates strongly to its crystalline structure, with the barrier property increasing with the degree to which the film is amorphous. It has also been observed, according to the present invention, that the amorphous structure of conventional refractory metal silicon-nitride compounds is strongly affected by the composition ratio of the non-metallic elements in the compound. For example, amorphous TaSiN has a relatively high silicon composition ratio, while amorphous TaN has a very large nitrogen composition ratio. However, these high silicon and nitrogen composition ratios are also reflected in very high resistivities.

FIG. 1 illustrates the relationship between silicon composition ratio in a TaSiN film, and its resistivity, plotted over various partial pressures of $N_2$ during the deposition, and thus over various composition ratios of nitrogen in the eventual film. These films, and their corresponding plots of FIG. 1, are formed according to conventional processing methods. Plot 2 corresponds to a partial nitrogen pressure of 8% of the total pressure in the sputtering apparatus. Preferably, only nitrogen and argon gases are present in the sputtering apparatus, in which case the partial nitrogen pressure is derived relative to the sum of the nitrogen and argon pressures. In the example of FIG. 1, plots 4, 6, 8 correspond to partial nitrogen pressures of 12%, 20%, and 30%, respectively. Each plot of FIG. 1 illustrates a knee in the resistivity curve at a silicon composition ratio of about 15%, below the crystal-to-amorphous transition of about 22%; at these knees, the resistivity of the film sharply increases, regardless of the nitrogen composition. Of course, as evident from a comparison of plots 2, 4, 6, 8, the resistivity of the resulting TaSiN films increases with higher partial nitrogen pressures, and thus with correspondingly higher nitrogen composition ratios in the eventual film.

In each case, according to conventional technology, amorphous films that are suitable for use as a diffusion barrier have exhibited high resistivity. For example, a common barrier material for copper is sputtered $Ta_{36}Si_{14}N_{50}$, in amorphous form. This film is an excellent diffusion barrier, as described in Kolawa, et al., "Sputtered Ta—Si—N Diffusion Barriers in Cu Metallizations for Si", *IEEE Electron Device Letters*, Vol. 12, No. 6 (June 1991), pp. 321–323; and in Kim, et al., "Nanostructured Ta—Si—N diffusion barriers for Cu metallization", *J. Appl. Phys.*, Vol. 82, No. 10 (November 1997), pp. 4847–4851. Similarly, sputtered TaSiN has been used as a barrier to oxygen diffusion, as described in Hara, et al., "Barrier Effect of TaSiN Layer for Oxygen Diffusion", *J. Electrochem. Soc.*, Vol. 143, No. 11 (November 1996), pp. L264–266. However, such films have been observed to exhibit a high resistivity, such as about 625

μΩ-cm, as described in Reid, et al., "Amorphous (Mo, Ta, or W)—Si—N diffusion barriers for Al metallizations", *J. App. Phys.*, Vol. 79, No. 2 (January 1996), pp. 1109–1115. This high resistivity can be a limiting factor in the performance of the copper metallization level, and thus in the performance of the overall integrated circuit.

BRIEF SUMMARY OF THE INVENTION

It is therefore an object of the present invention to provide an integrated circuit having a conductive but effective barrier layer.

It is a further object of the present invention to provide a method of manufacturing an integrated circuit having such a barrier layer underlying copper conductors.

It is a further object of the present invention to provide such a structure and method of manufacturing the same having such a barrier layer used in a ferroelectric memory capacitor.

It is a further object of the present invention to provide such an integrated circuit and method in which the barrier layer may be readily formed using existing equipment.

Other objects and advantages of the present invention will be apparent to those of ordinary skill in the art having reference to the following specification together with its drawings.

The present invention may be implemented into the manufacture of integrated circuits. A barrier layer of tantalum silicon nitride is formed to have relatively low silicon and nitrogen composition ratios. These low ratios are established for example by controlling the RF power applied to a silicon target in a sputtering system, and by providing relatively low nitrogen partial pressures in the system. Because the resulting film has an amorphous structure, it is an excellent diffusion barrier to copper ions; the low silicon and nitrogen composition ensures excellent conductivity in combination with the high barrier properties.

DETAILED DESCRIPTION OF THE INVENTION

As noted above, the present invention is directed to the formation of a barrier layer in the fabrication of an integrated circuit, with the barrier layer providing both an excellent diffusion barrier in combination with good conductivity. Considering the popularity of copper metallization in contemporary integrated circuits, and also the vulnerability of metal-oxide-semiconductor (MOS) transistors to junction poisoning caused by diffused copper ions, the preferred embodiment of the invention will be described relative to the example of copper metallization as used in connection with MOS circuits, and specifically relative to the damascene process for fabricating copper conductor levels. It is contemplated that the barrier layers and methods of forming described in this specification may also be used to advantage in connection with other metallization systems, materials, and methods of fabrication, and in connection with a wide variety of circuit applications, all within the scope of the invention as hereinafter claimed. For example, it is contemplated that the present invention may be used to form barrier layers in ferroelectric memory capacitors, to serve as a barrier to the diffusion of oxygen from ferroelectric materials such as PZT.

Furthermore, it will become apparent to those skilled in the art having reference to this specification that specific barrier materials other than those expressly described herein, but having similar properties as the described examples, may alternatively be used in connection with the present invention.

Referring now to FIGS. 2a through 2d, a method of fabricating an integrated circuit structure according to the preferred embodiment of the invention will now be described in detail. As noted above, this preferred embodiment of the invention is directed to an MOS integrated circuit utilizing copper metallization. In the exemplary embodiment of FIGS. 2a through 2d, the copper metallization will be described in connection with a first, or lowest, level metal layer, as this first level metal is particularly problematic from a metal ion diffusion standpoint. It is to be understood, of course, that the present invention is also equivalently applicable to upper level metal layers.

In any event, according to this preferred embodiment of the invention, copper conductors will be formed according to the so-called "damascene" process. As known in the art, non-volatile copper compounds are produced when copper films are chemically etched; because of their non-volatility, these compounds result in significant contamination of the integrated circuit structure. According to the damascene approach, copper conductor lines are effectively inlaid into slots or tracks etched into an insulator.

Figure 2A:
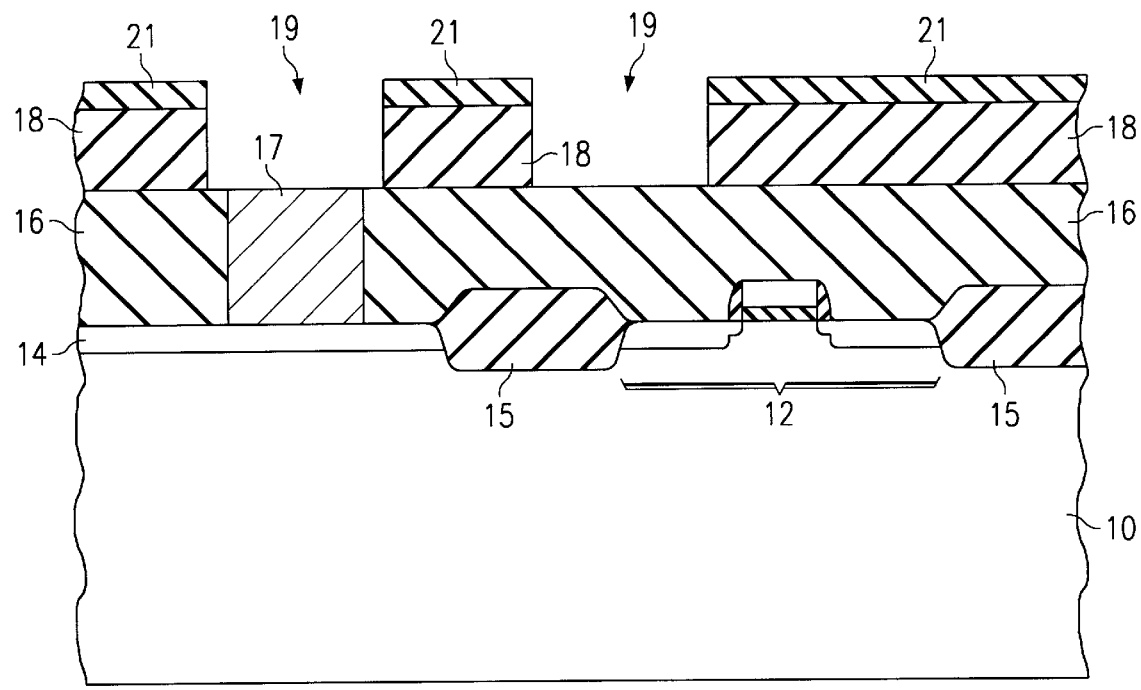
FIGS. 2a through 2d are cross-sectional diagrams illustrating the fabrication of an integrated circuit according to the preferred embodiment of the invention.

Referring first to FIG. 2a, a cross-section of a portion of a partially-fabricated integrated circuit according to the preferred embodiment of the invention is illustrated. In this example, MOS transistor 12 is already formed at a surface of substrate 10, and has the readily identifiable source, drain, and gate electrodes as shown in the Figure. While MOS transistor 12 is shown in this example as formed into substrate 10, it is of course contemplated that transistor 12 may be formed into an epitaxial layer at a surface of a substrate, into a silicon-on-insulator layer, or other arrangements. Furthermore, in the case of a complementary metal-oxide-semiconductor (CMOS) integrated circuit, both p-channel and n-channel transistors in the form of transistor 12 will be formed, typically into one or more wells or tubs formed at the surface of substrate 10. Further in the alternative, bipolar transistors may instead, or additionally, formed at the surface of substrate 10, depending upon the desired technology. Still further in the alternative, other passive and active components may also be formed at the surface of substrate 10, such components including capacitors, resistors, floating-gate transistors, ferroelectric memory elements, and the like.

In the simplified example of FIG. 2a, the active regions of substrate 10 are isolated from one another by field oxide structures 15, which may be formed by way of the well-known local oxidation of silicon (LOCOS) process, or by the deposition of silicon dioxide into trenches or recesses, depending upon the desired technology. In this example, field oxide structures 15 isolate transistor 12 from diffused contact region 14, which is a heavily doped region at the surface of substrate 10 to which contact will be made by the eventual copper metallization.

Insulator layer 16 is disposed over transistor 12 and contact region 14; typically, insulator layer 16 will include a deposited oxide, such as deposited by the chemical vapor deposition (CVD) of silicon dioxide from the decomposition of TEOS, or by a similar process. In this exemplary embodiment, an opening is etched through insulator layer 16, at a location defined by conventional photolithography. Conductive plug 17, formed of polysilicon, tungsten, or other deposited material is then formed in the conventional manner to fill this opening in insulator layer 16, making contact to contact region 14. It is contemplated that the structure of FIG. 2a may also include barrier layers, such as between plug 17 and contact region 14, silicide cladding of contact region 14 and elements in transistor 12, and other conventional structures and features as currently used in modern integrated circuits.

Insulator layer 18 overlies insulator layer 16, to define the locations of the eventual copper conductors. In this example, insulator layer 18 is another deposited film, such as deposited silicon dioxide, but alternatively may be silicon nitride, or another electrically insulating material. By way of further example, as described in Zielinski, et al., "Damascene integration of copper and ultra-low-k xerogel for high performance interconnects", *Technical Digest, International Electron Devices Meeting* (IEEE, 1997), pp. 936–938, incorporated herein by this reference, insulator layer 18 may be realized as a multilayer film including xerogel, an adhesion layer, and silicon dioxide. Optionally, stop layer 21 is then deposited overall. Stop layer 21 will typically be a different material than insulator layer 18. In the example where silicon dioxide serves as insulator layer 18, stop layer 21 is preferably silicon dioxide. In any event, stop layer 21 is formed of a material that is relatively more resistant to chemical mechanical polishing (CMP) than insulator layer 18 and than copper metallization, to provide process margin.

Openings 19 are then formed into insulator layer 18 and stop layer 21 at the locations at which the copper conductors are to be formed. According to the preferred embodiment of the invention, openings 19 are formed by conventional photolithographic techniques, with a mask layer (not shown) formed overall, followed by exposure and development of portions of the mask layer, to expose those portions of stop layer 21 and insulator layer 18 at the locations where openings 19 are to be formed. It is understood that those skilled in the art and having reference to this specification will readily comprehend the manner in which the locations of the copper metallization lines may be defined in this damascene manner. A suitable etchant is then applied to the structure, to form openings 19 through stop layer 21 and insulator layer 18, resulting in the structure of FIG. 2a. The top of contact plug 17 is exposed as a result of this etch, to permit contact to contact region 14 via plug 17.

Figure 2B:
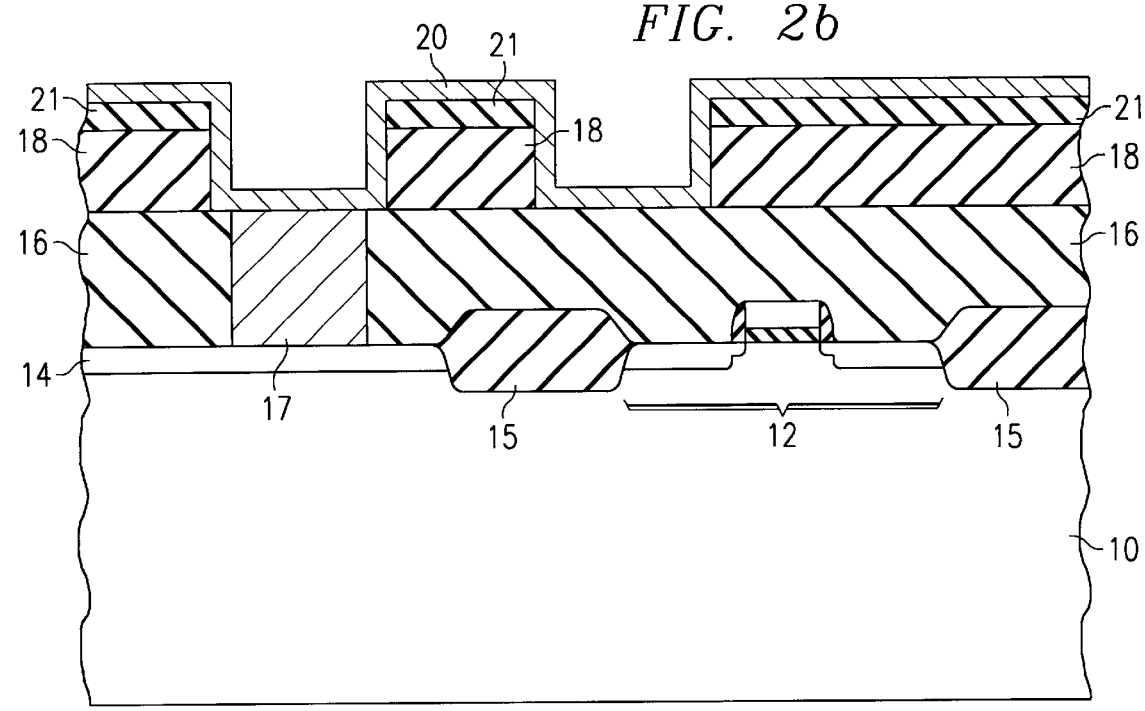
Figure 2C:
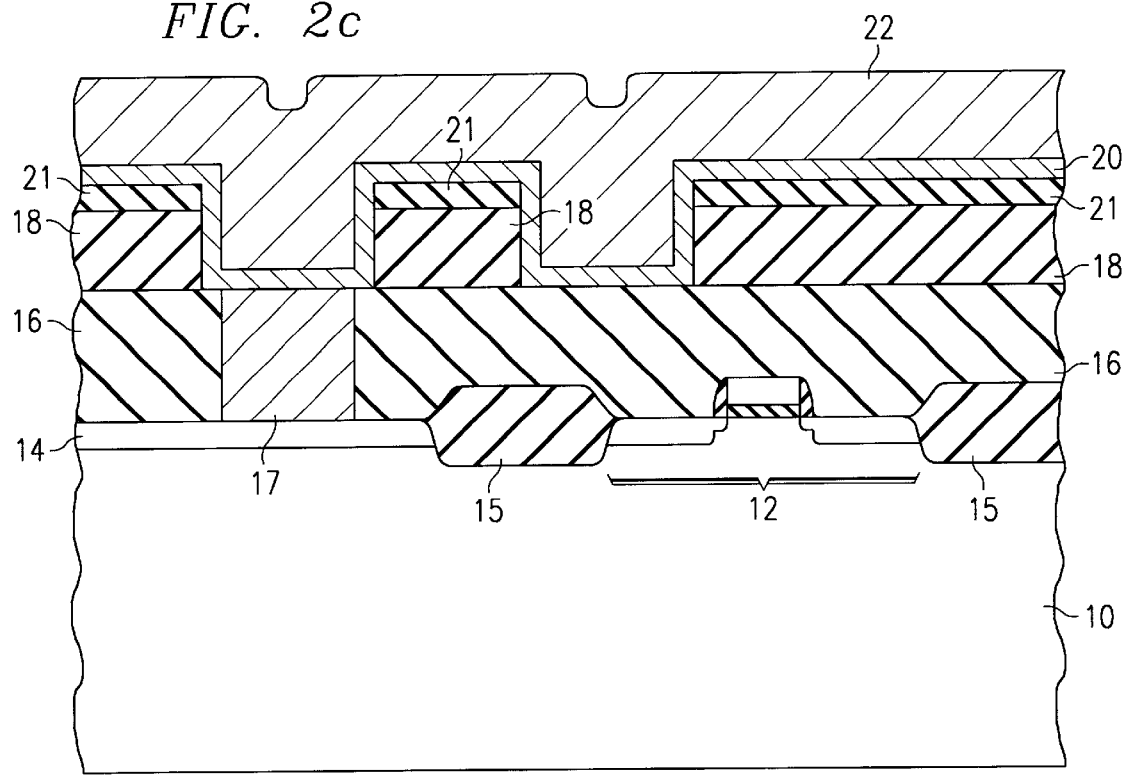

Referring now to FIG. 2b, barrier layer 20 is now deposited overall, including into openings 19, and in contact with contact plug 17. According to the preferred embodiment of the invention, barrier layer 20 is an amorphous film of a refractory metal silicon nitride compound, such as TaSiN. The amorphous state of barrier layer 20 provides excellent diffusion barrier properties in this film. Also according to the preferred embodiment of the invention, the silicon and nitrogen composition ratios are controlled to be relatively low in barrier layer 20, so that barrier layer 20 is also quite conductive.

Figure 3:
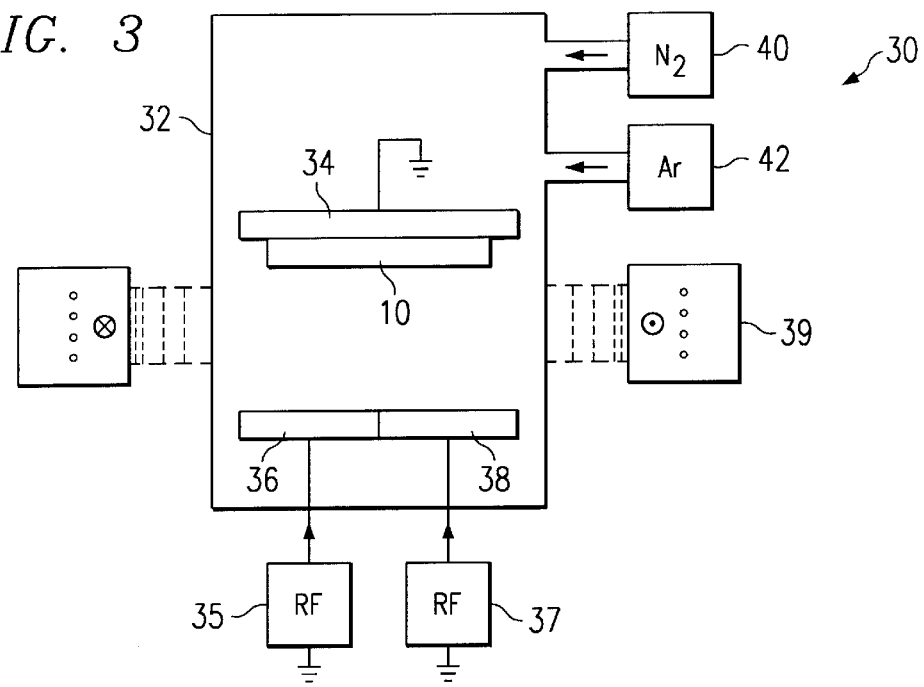
FIG. 3 is a schematic diagram of a sputtering apparatus for depositing a barrier layer according to the preferred embodiment of the invention.

According to the preferred embodiment of the invention, barrier layer 20 is formed by the RF co-sputtering of tantalum and silicon, in a low pressure chamber having a controlled flow of argon and nitrogen. FIG. 3 schematically illustrates RF sputtering system 30, for depositing barrier layer 20 according to the preferred embodiment of the invention. System 30 includes vacuum chamber 32, within which substrate holder 34 is provided to hold substrate 10, which is oriented upside-down in this example to receive barrier layer 20 at its active surface. Substrate holder 34 is biased to ground in this example. Tantalum target 36 and silicon target 38 are provided within chamber 32, biased by RF sources 35, 37, respectively. Electromagnet coil 39 is provided to confine a sputtering plasma between targets 36, 38, on one side, and substrate 10 on the other side. The plasma is struck in chamber 32 in argon gas provided by source 42, with nitrogen gas provided by controlled nitrogen source 40; nitrogen source 40 provides the nitrogen reagent for producing the TaSiN reaction product.

In operation, RF sources 35, 37 are controllably powered to provide the desired composition ratios of sputtered tantalum and silicon atoms, respectively. These sputtered atoms react with nitrogen gas in the plasma region between targets 36, 38 and substrate 10, with the resultant compound deposited on the exposed surface of substrate 10. The nitrogen composition ratio of the resulting compound is determined by the partial pressure of nitrogen provided by nitrogen source 40, relative to the total gas pressure provided by sources 40, 42 in combination.

It has been found, according to the present invention, that an amorphous film of a refractory metal silicon nitride compound, such as TaSiN, can be sputtered in such a manner that the silicon and nitrogen composition ratios can be kept quite low, thus providing a film with high conductivity. According to this preferred embodiment of the invention, barrier layer 20 is sputtered to have a silicon composition ratio (Si/Si+Ta) of about 20% or lower, and a nitrogen composition ratio (N/Si+Ta+N) of about 30% or lower, with an amorphous structure. The low silicon composition ratio is obtained by control of the RF power applied to silicon target 38 by RF source 37 relative to the RF power applied to tantalum target 36 by RF source 35, to obtain a silicon composition ratio of below 20%. In one example, the desired composition ratios were obtained by powering RF source 37 to around 150 watts and RF source 35 to around 500 watts; it is to be understood, however, that the specific RF power of RF sources 35, 37 is highly dependent upon the particular sputtering system 30. Additionally, the partial nitrogen pressure ($N_2/N_2+Ar$) provided by nitrogen source 40 according to this preferred embodiment of the invention is maintained at about 8% or lower, in combination with the low silicon composition ratio noted above.

It is contemplated that other methods of forming barrier layer 20 of TaSiN may alternatively be used in connection with the present invention. For example, a tantalum-silicide target may be used in the sputtering apparatus, where the ratio of tantalum to silicon in the target corresponds to the composition ratio in the eventual film. In particular, it has been observed, in connection with the present invention, that there is no difference in the composition of the resulting barrier layer 20 between the co-sputtering process described above and the use of a single tantalum silicide sputtering target. Further in the alternative, it is contemplated that chemical vapor deposition techniques may be developed for the deposition of TaSiN in the desired composition ratios. In any case, barrier layer 20 is to be formed to have an amorphous structure, with low composition ratios of silicon and nitrogen in the film.

Figure 4:
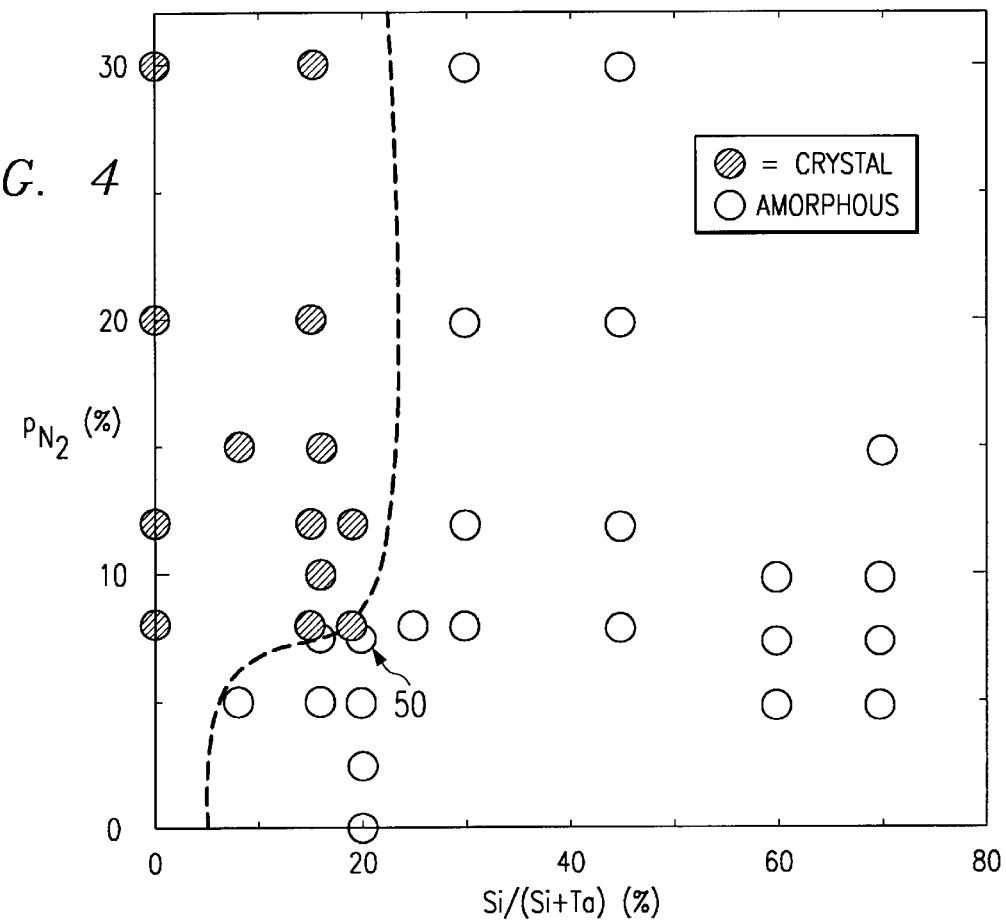
FIG. 4 is a cross-plot of nitrogen partial pressure and silicon composition ratio, illustrating regions in which a resulting film is deposited in crystalline and amorphous states.

FIG. 4 illustrates plots of nitrogen partial pressure versus silicon composition ratio for examples of sputtered TaSiN barrier material, with indications of whether the resulting film is amorphous or crystalline. The films represented in FIG. 4 are formed by either co-sputtering or by sputtering from a tantalum silicide target; as noted above, no difference in the resulting film composition has been observed between these two approaches. As shown in FIG. 4, a surprising bend in the amorphous-crystalline boundary has been found, according to the present invention. This bend illustrates that an amorphous film of TaSiN may be formed with very low silicon and nitrogen composition ratios. Point 50 is located at the corner of this bend, and corresponds to a silicon composition ratio (Si/Si+Ta) of about 20%, and at a nitrogen composition ratio (N/Si+Ta+N) of about 30%, which is formed at a nitrogen partial pressure $p_{N2}$ of about 7.5% ($N_2/N_2+Ar$). At still lower silicon and nitrogen composition ratios, the resulting barrier layer 20 remains amorphous, as shown in FIG. 4.

Figure 5:
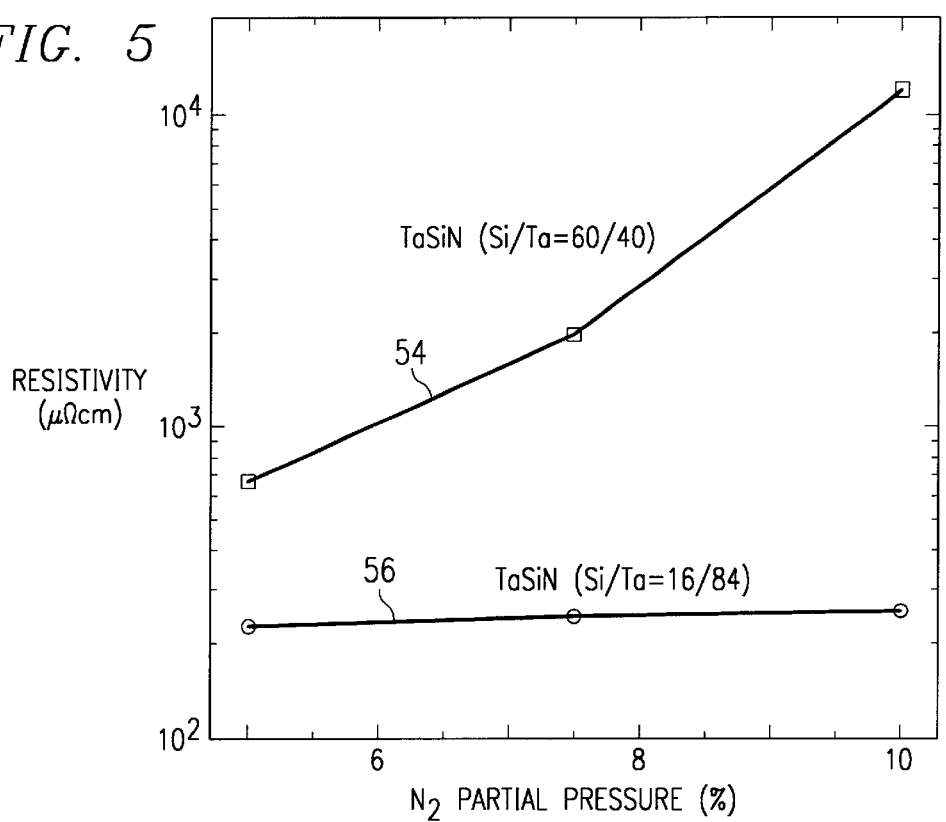
FIG. 5 is a plot of resistivity versus nitrogen partial pressure for a conventional barrier layer and for a barrier layer formed according to the preferred embodiment of the invention.

According to the preferred embodiment of the invention, as noted above, highly conductive amorphous films are formed by sputtering, to produce excellent diffusion barrier layers 20. FIG. 5 illustrates plots of film resistivity, in $\mu\Omega$cm, versus nitrogen partial pressure (in % of total pressure). Plot 54 corresponds to a conventional amorphous TaSiN film, where the silicon-to-tantalum ratio is about 60/40; in other words, the silicon composition ratio (Si/Si+Ta) is about 60%. As evident from plot 54, the resistivity of this conventional film increases from about 700 $\mu\Omega$cm at low $N_2$ partial pressure, up t about 10,000 $\mu\Omega$cm at a $N_2$ partial pressure of about 10%.

Plot 56 illustrates the resistivity of an amorphous TaSiN film formed as barrier layer 20 according to the preferred embodiment of the invention. In this example, the silicon-to-tantalum ratio is about 16/84, resulting in a silicon composition ratio (Si/Si+Ta) of about 16%. As evident from FIG. 5, the resistivity of this film remains flat over low $N_2$ partial pressures, ranging from about 5% to about 10%, and at a low resistivity value of about 220 to 240 $\mu\Omega$cm. Barrier layer 20 according to this example thus provides a highly conductive film.

Figure 6:
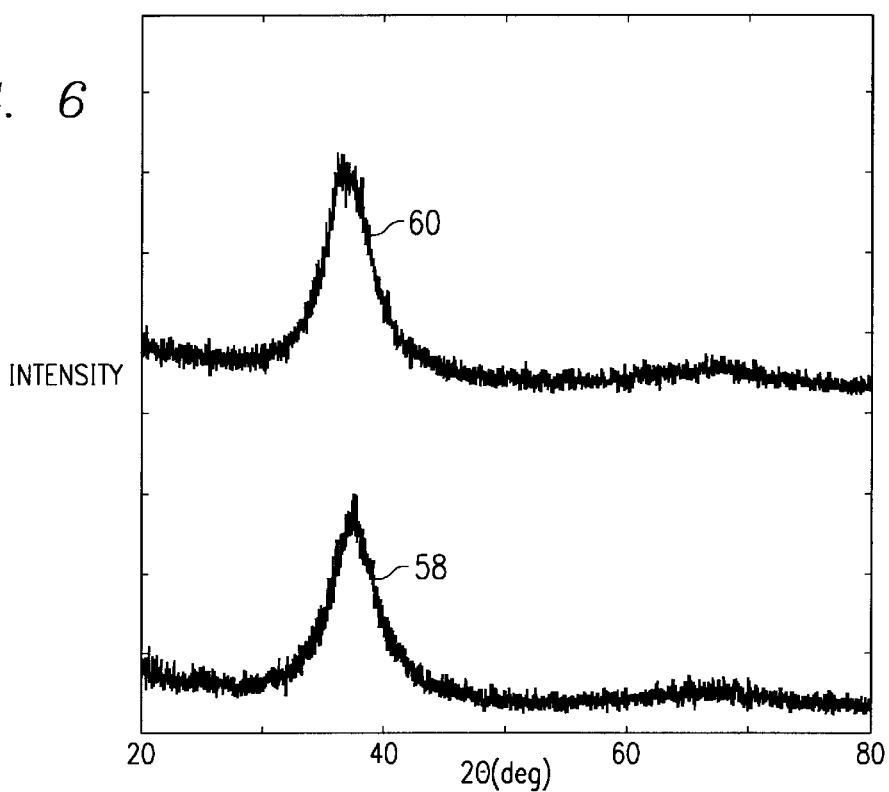
FIG. 6 is a plot of XRD intensity over angle of incidence for a barrier layer formed according to the preferred embodiment of the invention, both as deposited and after an anneal.

In addition to this excellent conductivity, barrier layer 20 formed according to the preferred embodiment of the invention provides excellent diffusion barrier properties because of its amorphous structure. FIG. 6 illustrates x-ray diffraction (XRD) patterns of a TaSiN film corresponding to that of plot 56 in FIG. 5, and thus having a silicon composition ratio (Si/Si+Ta) of about 16%, at a nitrogen partial pressure of 5%. Plot 58 corresponds to the XRD pattern of this example of barrier layer 20 as deposited, and plot 60 corresponds to the XRD pattern of this film after anneal at 900° C. for twenty minutes in a dilute (2%) hydrogen atmosphere. In each case, the XRD patterns exhibit relatively broad peaks of intensity, which indicates that barrier layer 20 is in an amorphous state. The maintaining of this broad peak after the anneal indicates that this amorphous state is thermally stable over subsequent thermal processing.

Accordingly, barrier layer 20 formed according to the preferred embodiment of the invention provides excellent diffusion barrier properties because of its amorphous state, in combination with low resisitivity. Referring to FIG. 2b, barrier layer 20 will thus provide a very conductive interface between the top surface of plug 17, for example, and the overlying metallization yet to be formed.

Referring back to FIG. 2c, the process of fabricating the integrated circuit according to the preferred embodiment of the invention continues with the deposition of copper metallization layer 22. As is well known in the art, the deposition of copper is conventionally performed in a two-step process, with a first step depositing a relatively thin layer of copper overall as a seed layer for electroplating of copper. Barrier layer 20 serves as an adhesion layer for this seed layer. The seed layer deposition is conventionally carried out by way of physical vapor deposition (PVD) or chemical vapor deposition (CVD). The remainder of copper layer 22, which is the large majority of the overall thickness of the copper film, is then electroplated overall, resulting in copper layer 22 of FIG. 2c.

Figure 2D:
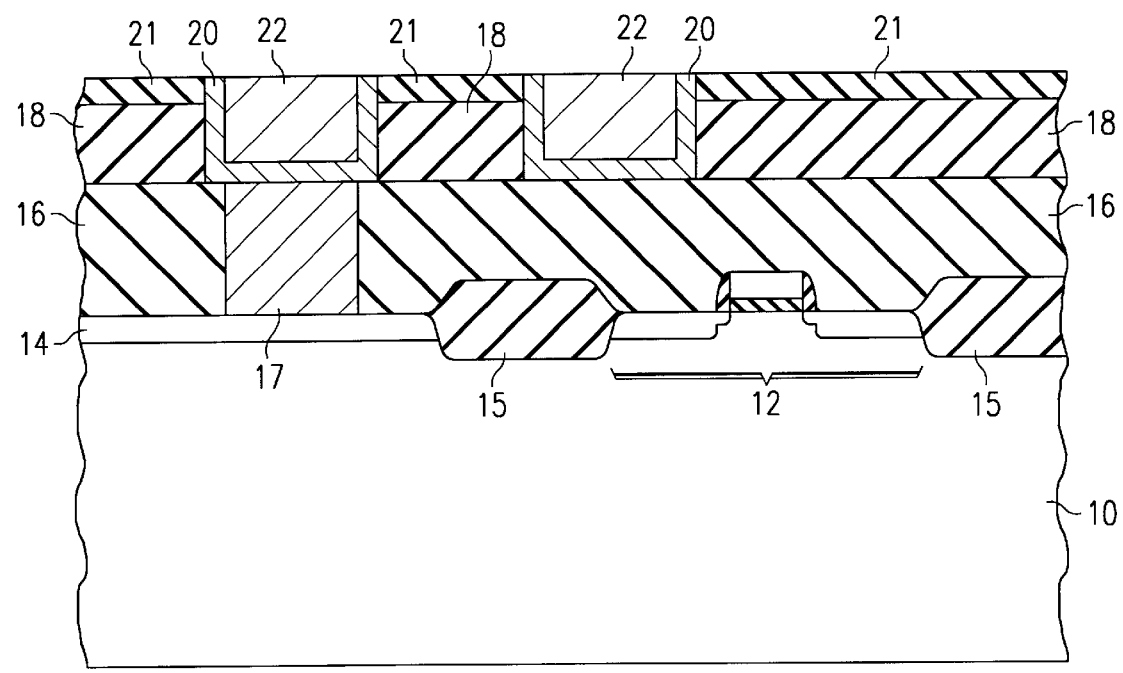

Following the deposition of copper layer 22 in this manner, the actual copper conductor lines are then defined by chemical-mechanical polishing (CMP) of the wafer containing the integrated circuit structure, leveling off copper layer 22 relative to the top surface of insulator layer 18, in this embodiment of the invention. FIG. 2d illustrates the result of this CMP processing, in which copper layer 22 is removed from locations overlying defining insulating layer 18, but remains within the previously defined openings CT at which copper conductor lines are to run. This CMP is performed down to, and possibly into, stop layer 21 at the surface of insulator layer 18.

Following the CMP processing that results in the definition of conductors formed of copper layer 22, as illustrated in FIG. 2d, additional insulating layers and copper conductive layers are then formed, for example by way of additional iterations of the damascene process. Vias through these further additional insulating layers may be filled with copper, tungsten, or some other metal, to interconnect multiple metallization layers, in similar manner as plug 17. Additionally, these higher levels of metallization may also make direct contact to silicon structures such as contact regions 14 or polysilicon elements such as the gate of transistor 12. These higher levels may be formed according to the method of the preferred embodiment of the invention described above, or alternatively according to conventional processes. Following the fabrication of all levels of metallization specified by the design of the overall integrated circuit, wafer fabrication will generally be completed by the application of a protective overcoat, through which openings to metal bond pads or other connective lands are made. Following wafer fabrication and any desired electrical testing of the integrated circuits in wafer form, such "back-end" processes as dicing of the individual circuits from the wafer, electrical test, packaging, burn-in, and additional electrical testing, are then typically performed to result in a packaged integrated circuit that may then be implemented into end equipment; it is understood that such additional wafer fabrication and back-end processes shall not constitute a material change in the integrated circuit structure described herein.

Figure 1:
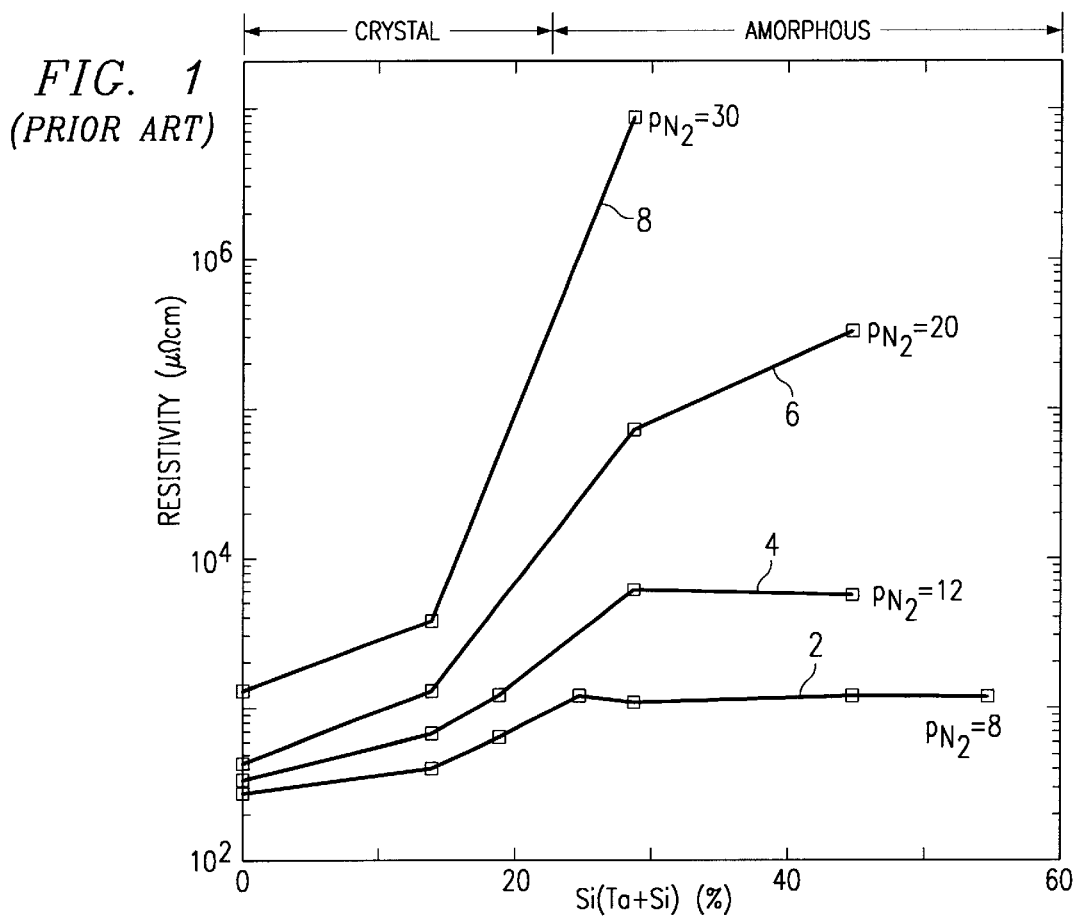
FIG. 1 is a plot of resistivity versus silicon composition ratio for examples of conventional TaSiN barrier films, over various partial nitrogen pressures.
Figure 7:
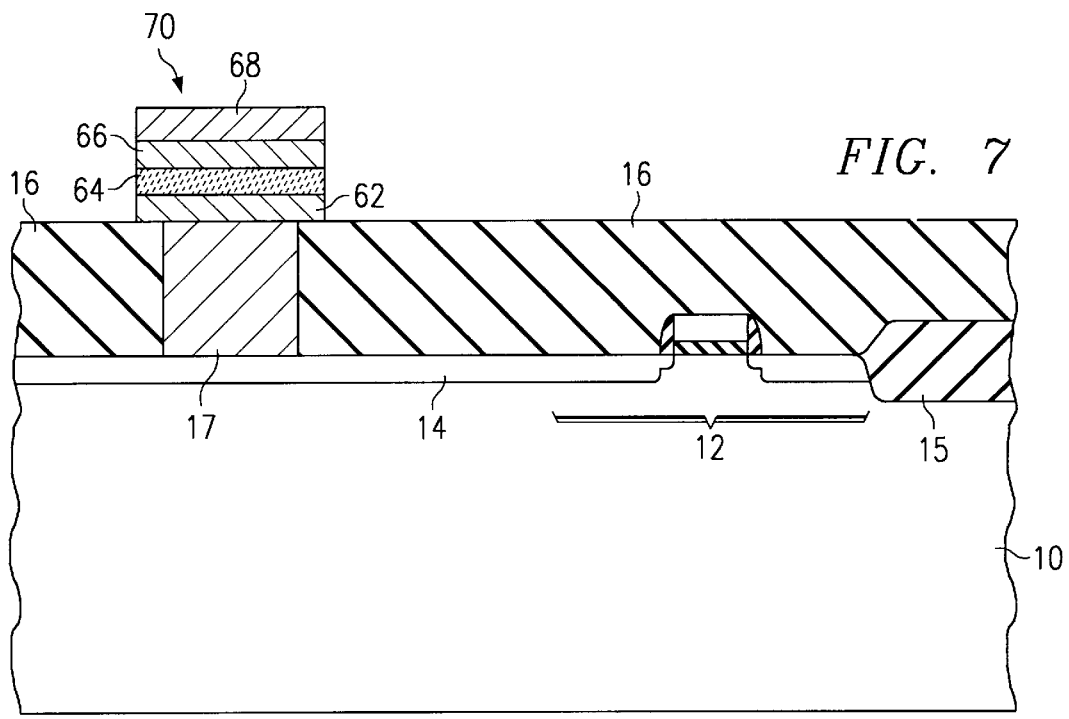
FIG. 7 is a cross-sectional diagram illustrating a ferroelectric memory capacitor including a barrier layer formed according to the preferred embodiment of the invention.

Referring now to FIG. 7, ferroelectric memory capacitor 70 according to an alternative implementation of the preferred embodiment of the invention will now be described. In this example, transistor 12, field oxide structures 15, insulator layer 16, and contact plug 17, are formed at a surface of substrate 10 as before, and as such these elements are referred to by the same reference numerals. In this example, however, diffused contact region 14 extends to transistor 12, and as such contact plug 17 serves as a contact to the source or drain region, as the case may be, of transistor 12.

Ferroelectric memory capacitor 70 overlies insulator layer 16 in this example, and has a lower plate that is in electrical contact with transistor 12 via contact plug 17. In this implementation, lower barrier layer 62 serves as this lower plate, and is formed of an amorphous film of a refractory metal silicon compound formed according to the preferred embodiment of the invention, having relatively low composition ratios for the silicon and nitrogen species. For example, a preferred material for lower barrier layer 62 is an amorphous film of TaSiN, for example having a silicon composition ratio (Si/Si+Ta) of less than about 20%, and having a nitrogen composition ratio (N/N+Si+Ta) of less than about 30%. Lower barrier layer 62 is deposited as described above, for example by way of sputtering or deposition. Alternatively, an additional metal layer, such as platinum, tungsten, or some other refractory metal, may be provided either over or under lower barrier layer 62, as part of the lower plate of ferroelectric memory capacitor 70.

Ferroelectric material 64 overlies lower barrier layer 62 in this example. A preferred species of ferroelectric material 64 is lead zirconium titanate, commonly referred to as PZT, deposited in the conventional manner such as by way of the well-known solgel process. Upper barrier layer 66, preferably formed of the same material in the same amorphous state as lower barrier layer 62, overlies ferroelectric material 64. According to this implementation, upper barrier layer 66 is preferably formed in the same manner as lower barrier layer 62. Metal electrode 68 overlies upper barrier layer 66, to provide electrical contact to this upper plate of ferroelectric memory capacitor 70. Also in the alternative, an additional metal layer may be provided on either side of upper barrier layer 66, if desired, to form part of the upper plate of ferroelectric memory capacitor 70.

The geometry of ferroelectric memory capacitor 70 is defined by way of conventional photolithography and etching. For example, layers 62, 64, 66, 68 may all be formed, and photolithographically patterned and etched as a stack, to provide the structure illustrated in FIG. 7. Alternatively, the layers may be individually patterned and etched to form the capacitor in another non-stack geometry. Such an alternative geometry is described in Onishi, et al., "A Half-Micron Ferroelectric Memory Cell Technology with Stacked Capacitor Structure", *Technical Digest, Int'l Electron Devices Meeting*, paper 32.4.1 (IEEE, 1994), incorporated herein by this reference; according to this alternative implementation of the present invention, barrier layers 62, 66 are provided in combination with, or instead of, the particular films described in this reference.

In any event, lower barrier layer 62 according to this preferred embodiment of the invention provides a highly conductive barrier layer, thus facilitating the electrical connection of the lower plate of ferroelectric memory capacitor 70 to transistor 12. As described above, this excellent conductivity results from the relatively low silicon and nitrogen composition ratios in the film. In addition, however, the amorphous structure of lower barrier layer 62 provides excellent diffusion barrier performance, thus preventing the diffusion of oxygen from the PZT material into contact plug 17; such oxygen diffusion would degrade the contact resistance of plug 17. These properties may also be provided by upper barrier layer 66, as appropriate.

According to the preferred embodiment of the invention, therefore, a highly conductive, yet highly effective, diffusion barrier layer is formed. This barrier layer is suitable for use in combination with conductive metallization such as copper, and may also be used as a barrier layer underlying or surrounding ferroelectric material such as PZT. According to the preferred embodiment of the invention, this barrier material takes advantage of the surprising observation that an amorphous film may be formed of a refractory metal silicon nitride compound that has low composition of silicon and nitrogen. This combination permits the combination of an electrically conductive amorphous barrier layer, thus achieving a combination of properties that were previously thought to be mutually exclusive of one another.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. An integrated circuit structure formed at a semiconductor surface of a substrate, comprising:

a first insulator layer formed near the surface and having openings therein;

a barrier layer disposed within the openings of the first insulator layer, comprising a compound of refractory metal and silicon, where the ratio of the number of silicon atoms relative to the number of refractory metal atoms and silicon atoms is at or less than about 20%, the barrier layer being substantially in an amorphous state; and metal conductors disposed within the openings of the first insulator layer over the barrier layer.

2. The structure of claim 1, wherein the compound comprising the barrier layer is a compound of the refractory metal, silicon, and nitrogen.

3. The structure of claim 2, wherein the ratio of nitrogen atoms to the total of nitrogen atoms, silicon atoms, and the refractory metal atoms in the barrier layer is at or less than about 30%.

4. The structure of claim 2, wherein the refractory metal is tantalum.

5. The structure of claim 4, wherein the metal conductor comprises copper.

6. The structure of claim 5, wherein the semiconductor surface comprises silicon.

7. The structure of claim 1, wherein the refractory metal is tantalum.

8. The structure of claim 1, wherein the metal conductor comprises copper.

9. The structure of claim 8, wherein the semiconductor surface comprises silicon.

10. The structure of claim 1, further comprising:

a second insulator layer, disposed between the first insulator layer and the surface, the second insulator layer having at least one opening therein to expose a silicon structure at the surface;

wherein at least one metal conductor is electrically in contact with the silicon structure through a portion of the barrier layer.

11. The structure of claim 10, further comprising:

a plug structure disposed within the at least one opening in the second insulator layer:

wherein the at least one metal conductor is electrically in contact with the silicon structure through the portion of the barrier layer and through the plug structure.

12. The structure of claim 11, further comprising:

at least one transistor formed at the surface, underlying the second insulator layer.

13. The structure of claim 11, wherein the silicon structure comprises a contact region in the semiconductor surface of the substrate.

* * * * *